(12) United States Patent
Akiyama

(10) Patent No.: US 9,343,628 B2
(45) Date of Patent: May 17, 2016

(54) SEMICONDUCTOR LIGHT EMITTING DEVICE

(71) Applicant: KABUSHIKI KAISHA TOSHIBA, Tokyo (JP)

(72) Inventor: Kazuhiro Akiyama, Nomi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/475,530

(22) Filed: Sep. 2, 2014

(65) Prior Publication Data
US 2015/0263241 A1  Sep. 17, 2015

(30) Foreign Application Priority Data
Mar. 14, 2014  (JP) ................................. 2014-051271

(51) Int. Cl.
| | |
|---|---|
| H01L 33/00 | (2010.01) |
| H01L 21/00 | (2006.01) |
| H01L 33/38 | (2010.01) |
| H01L 33/44 | (2010.01) |
| H01L 33/52 | (2010.01) |
| H01L 33/46 | (2010.01) |
| H01L 33/48 | (2010.01) |

(52) U.S. Cl.
CPC .............. *H01L 33/387* (2013.01); *H01L 33/44* (2013.01); *H01L 33/52* (2013.01); *H01L 33/0079* (2013.01); *H01L 33/38* (2013.01); *H01L 33/46* (2013.01); *H01L 33/486* (2013.01); *H01L 2933/005* (2013.01); *H01L 2933/0041* (2013.01)

(58) Field of Classification Search
CPC .............................. H01L 33/387; H01L 33/52
USPC ......................................... 438/29, 42; 257/98
See application file for complete search history.

(56) References Cited

U.S. PATENT DOCUMENTS

| | | | |
|---|---|---|---|
| 8,110,421 B2* | 2/2012 | Sugizaki et al. ................ | 438/26 |
| 2010/0148198 A1 | 6/2010 | Sugizaki et al. | |
| 2011/0037098 A1 | 2/2011 | Kim et al. | |

FOREIGN PATENT DOCUMENTS

| | | |
|---|---|---|
| JP | 2003257879 A | 9/2003 |
| JP | 2007189060 A | 7/2007 |
| TW | 2006-20708 | 6/2006 |

OTHER PUBLICATIONS

Taiwan Office Action dated Dec. 7, 2015 in counterpart Taiwant Patent Application 103125361 with English Translation.

* cited by examiner

*Primary Examiner* — Calvin Lee
(74) *Attorney, Agent, or Firm* — Patterson & Sheridan, LLP

(57) ABSTRACT

A light emitting device includes a first layer of a first conductivity type, a second layer of a second conductivity type, and a light emitting layer between the first and second layers. A resin layer is disposed on a first surface of the first layer. The first layer has an outer portion that extends beyond the second and light emitting layers to an outer edge. A first electrode contacts the first layer in the outer portion on a second surface opposite the first surface; and a second electrode contacts the second layer. A first insulating material contacts the first surface in the outer portion of the first layer and has a wall surface extending from the first surface at a position that is in the outer portion and spaced from the outer edge.

9 Claims, 16 Drawing Sheets

SEMICONDUCTOR LIGHT EMITTING DEVICE

CROSS-REFERENCE TO RELATED APPLICATION

This application is based upon and claims the benefit of priority from Japanese Patent Application No. 2014-051271, filed Mar. 14, 2014, the entire contents of which are incorporated herein by reference.

FIELD

Embodiments described herein relate generally to a semiconductor light emitting device.

BACKGROUND

Semiconductor light emitting devices having chip-size package structures of combinations of light emitting diodes (LEDs) and fluorescent substances have been developed. These semiconductor light emitting devices may emit visible light such as white light, or light of other wavelength ranges, and thus may be used for a variety of purposes. However, there is still room for improvement on optical properties such as a brightness distribution.

DETAILED DESCRIPTION

Figure 1:
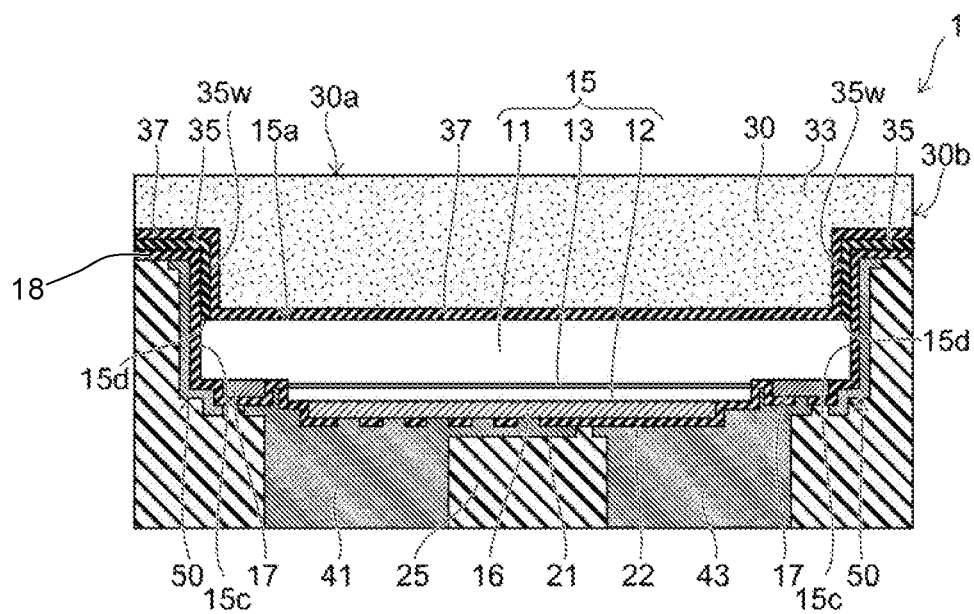
FIG. 1 is a cross-sectional view schematically illustrating a semiconductor light emitting device according to a first embodiment.

Embodiments provide a semiconductor light emitting device having improved optical properties.

A light emitting device includes a first layer of a first conductivity type (e.g., n-type), a second layer of a second conductivity type (e.g., p-type), and a light emitting layer between, in a first direction, the first and second layers. A resin layer is disposed on a first surface of the first layer such that the first layer is between the resin layer and the second layer in the first direction. The first layer has an outer portion that extends beyond the second and light emitting layers in a second direction perpendicular to the first direction to an outer edge. A first electrode contacts the first layer in the outer portion on a second surface opposite the first surface; and a second electrode contacts the second layer. A first insulating material contacts the first surface in the outer portion of the first layer and has a wall surface extending in the first direction from the first surface at a position that is in the outer portion and spaced in the second direction from the outer edge.

In general, according to one embodiment, a semiconductor light emitting device includes a laminate which includes an n-type semiconductor layer, a p-type semiconductor layer, and a light emitting layer provided between the n-type semiconductor layer and the p-type semiconductor layer. The laminate has a first surface side and a second surface side which is opposite to the first surface side. Further, the semiconductor light emitting device includes an n-side wiring portion that is provided on the second surface side and is electrically connected to the n-type semiconductor layer, a p-side wiring portion that is provided on the second surface side and is electrically connected to the p-type semiconductor layer, a first insulating film that is provided so as to be in contact with outer edge portions of the first surface and has a wall surface positioned inside the outer edge portions of the first surface, and transmits light emitted by the light emitting layers, and a resin layer that is provided on the first surfaces so as to cover the wall surfaces, and transmits the light emitted by the light emitting layers.

Hereinafter, embodiments will be described with reference to the accompanying drawings. Identical or substantially similar portions in the drawings are denoted by the same reference symbols and detailed descriptions thereof may be appropriately omitted, and different portions will be described. Also, the drawings are schematic or conceptual, and the relation between the thickness and width of each portion, the size ratio of portions, and the like are not necessarily the same as those in reality. Further, identical portions may be shown with different dimensions or ratios depending on the drawings.

First Embodiment

FIG. 1 is a cross-sectional view schematically illustrating a semiconductor light emitting device 1 according to a first embodiment.

Figure 2A:
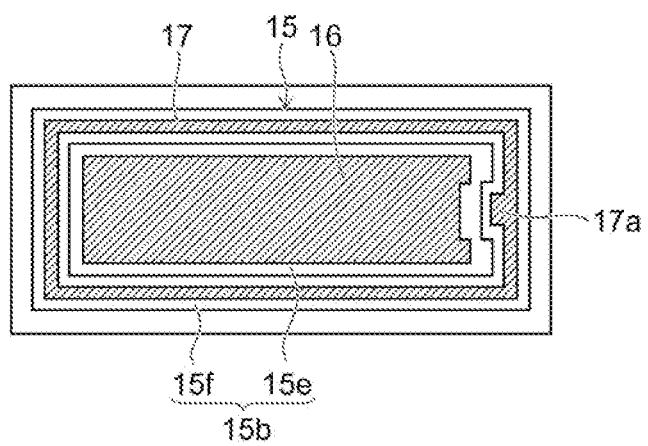
FIGS. 2A and 2B are plan views schematically illustrating the configuration of the semiconductor light emitting device according to the first embodiment.
Figure 2B:
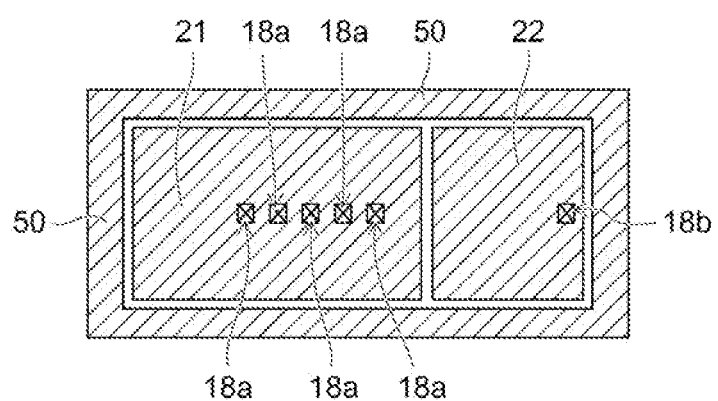

FIGS. 2A and 2B are plan views schematically illustrating the configuration of the semiconductor light emitting device 1 according to the first embodiment.

The semiconductor light emitting device 1 is, for example, an LED using a nitride semiconductor material. The semiconductor light emitting device 1 includes a laminate 15 which includes, for example, an n-type semiconductor layer 11, a p-type semiconductor layer 12, and a light emitting layer 13. The light emitting layer 13 is provided between the n-type semiconductor layer 11 and the p-type semiconductor layer 12.

Each laminate 15 has a first surface 15a, a second surface 15b which is the opposite side to the first surface 15a (see FIG. 4A), and a side surface (hereinafter, referred to as a side surface 15c) which is in contact with the first surface 15a and the second surface 15b.

The semiconductor light emitting device 1 further includes a p-side wiring portion 41 and an n-side wiring portion 43. The p-side wiring portion 41 is provided on the second surface (15b) side, and is electrically connected to the p-type semiconductor layers 12. For example, the p-side wiring portion 41 is electrically connected to p-side electrode 16 which are in contact with the p-type semiconductor layers 12, respectively. The n-side wiring portion 43 is provided on the second surface (15b) side, and is electrically connected to the n-type semiconductor layers 11. For example, the n-side wiring portion 43 is electrically connected to n-side electrodes 17 which are in contact with the n-type semiconductor layers 11, respectively.

Between the p-side wiring portion 41 and the n-side wiring portion 43, a resin layer 25 is provided. The p-side wiring portion 41, the n-side wiring portion 43, and the resin layer 25 configure a support that supports the laminate 15.

On the first surface (15a) sides of the laminate 15, a resin layer 30 is provided. The resin layer 30 is formed of a transparent resin transmitting emitted light of the light emitting layer 13, and may include, for example, a fluorescent substance 33. The fluorescent substance 33 absorbs the emitted light of the light emitting layer 13, and emits light having wavelengths different from the wavelengths of the emitted light.

Here, it should be understood that when an element is referred to as "transmitting light", it may have a transmittance of 100% or may absorb a portion of light and transmit less than 100% of the light. Also, when an emission wavelength of the light emitting layers and the fluorescent substance is referred to this means peak wavelengths in the spectrums of light emitted from them, respectively.

The semiconductor light emitting device 1 further includes a first insulating film (hereinafter, referred to as an insulating film 35) which is provided on the first surface (15a) sides of the laminate 15. The insulating film 35 is provided so as to be in contact with outer edge portion(s) 15d of the first surface 15a and thus surrounds the first surface 15a. The insulating film 35 has wall surfaces 35w positioned inside the outer edge portions 15d of the first surfaces 15a. Also, the insulating film 35 is, for example, a silicon nitride film or a silicon oxide film, and transmits emitted light of the light emitting layer 13.

The resin layer 30 is provided so as to cover the first surfaces 15a and the wall surfaces 35w of the insulating film 35. Here, it should be understood that when an element is referred to as "covering another element", it may be in direct contact with the other element or another element (or elements) may be interposed between.

For example, between the laminate 15 and the resin layer 30, and between the insulating film 35 and the resin layer 30, a second insulating film (hereinafter, referred to as an insulating film 37) may be provided. The insulating film 37 is, for example, a silicon oxide film, and improves adhesion between the laminate 15 and the resin layer 30.

Further, the semiconductor light emitting device 1 includes metal films 50 which are provided on the opposite side of the insulating film 35 to the wall surfaces 35w, with an insulating film 18 (see FIGS. 1 and 5B) interposed therebetween. The insulating film 18 is, for example, a silicon oxide film, and covers the second surfaces 15b of the laminate 15, and the side surfaces 15c of the laminate 15.

As illustrated in FIG. 1, the metal films 50 cover the side surfaces 15c of the laminate 15, and reflect emitted light of the light emitting layers 13. Each metal film 50 has, for example, a laminate structure which includes an aluminum film being in contact with the insulating film 18.

FIG. 2A is a plan view schematically illustrating the second surface (15b) side of the laminate 15 except for the p-side wiring portion 41, the n-side wiring portion 43, the resin layer 25, and the insulating film 18.

The second surface 15b of each laminate 15 has a portion (an emitting region 15e) which includes the light emitting layer 13, and a portion (a non-emitting region 15f) which does not include the light emitting layer 13. On the emitting region 15e, the p-side electrode 16 is formed. On the non-emitting region 15f, the n-side electrode 17 is formed.

As illustrated in FIG. 2A, for example, the non-emitting region 15f is provided so as to surround the emitting region 15e. Further, the n-side electrode 17 is formed, for example, so as to surround the p-side electrode 16. Also, FIG. 2A just illustrates an example of a planar layout of the p-side electrode 16 and the n-side electrode 17, and does not limit the present disclosure.

FIG. 2B is a plan view schematically illustrating a p-side wiring layer 21, an n-side wiring layer 22, and the metal film 50 which are provided on the second surface (15b) side of the laminate 15.

The p-side wiring layer 21, the n-side wiring layer 22, and the metal film 50 are provided on the insulating film 18 covering the laminate 15, the p-side electrode 16, and the n-side electrode 17. The p-side wiring layer 21 is electrically connected to the p-side electrode 16 through openings 18a formed in the insulating film 18.

The area of the emitting region 15e is set to be larger than the area of the non-emitting region 15f, such that light output is improved. Further, the plurality of openings 18a are formed in the insulating film 18 so as to be connected to the p-side electrode 16 such that an electric current flows uniformly in the emitting region 15e. This example does not limit the embodiment. For example, the p-side wiring layer 21 may be connected to the p-side electrode 16 through one opening having an area larger than that of the opening 18a illustrated in FIG. 2B.

The n-side wiring layer 22 is electrically connected to the n-side electrode 17 through an opening 18b formed in the insulating film 18.

For example, it is preferable that each of the p-side electrode 16, the n-side electrode 17, the p-side wiring layer 21, the n-side wiring layer 22, and the metal film 50 includes a member which is provided on its surface being in contact with the insulating film 18 and reflects emitted light of the light emitting layer 13.

In the semiconductor light emitting device 1, an electric current is supplied to the light emitting layer 13 through the p-side electrode 16 and the n-side electrode 17, whereby the light emitting layer 13 emits light. Further, the light emitted from the light emitting layer 13 is emitted from the first surface (15a) side to the outside of the laminate 15. Therefore, if the p-side electrode 16, the n-side electrode 17, the p-side wiring layer 21, the n-side wiring layer 22, and the metal film 50 provided on the second surface (15b) side serve as reflective layers, it is possible to improve the intensity of light to be emitted from the first surface (15a) side of the laminate 15.

Further, the insulating film 35 provided along the outer edges of the first surfaces 15a guides the emitted light of the light emitting layers 13 toward a light emitting surface 30a (the upper surface of the resin layer 30). Therefore, it is possible to improve brightness at an end portion of the light emitting surface 30a. That is, it is possible to uniformize (make more uniform) the brightness at the light emitting surface of the semiconductor light emitting device 1.

For example, if the refractive index of the insulating film 35 is set to be larger than the refractive index of the insulating film 37, it is possible to efficiently guide the emitted light of the light emitting layer 13 toward the light emitting surface 30a. For example, it is preferable to use a silicon nitride film as the insulating film 35 and use a silicon oxide film as the insulating film 37. Also, it is preferable that the refractive index of the resin layer 30 should be smaller than the refractive index of the insulating film 35.

Subsequently, a method of manufacturing the semiconductor light emitting device 1 will be described with reference to FIGS. 3A to 10B. FIGS. 3A to 10B are cross-sectional views schematically illustrating processes of manufacturing the semiconductor light emitting device 1.

Figure 3A:
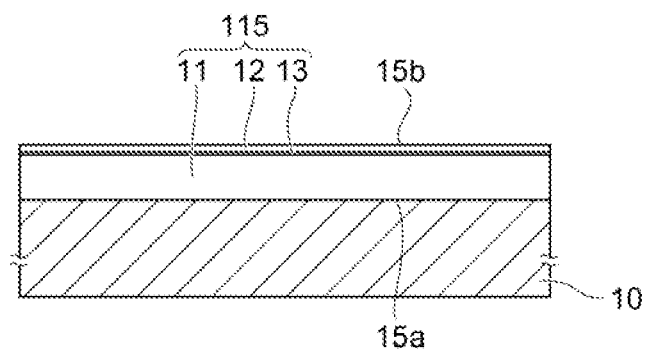
FIGS. 3A and 3B are cross-sectional views schematically illustrating processes of manufacturing the semiconductor light emitting device according to the first embodiment.

FIG. 3A is a cross-sectional view illustrating a semiconductor layer 115 formed on a substrate 10. The semiconductor layer 115 has a laminate structure including the n-type semiconductor layer 11, the p-type semiconductor layer 12, and the light emitting layer 13. The semiconductor layer 115 is formed, for example, by a metal organic chemical vapor deposition (MOCVD) method. That is, on the substrate 10, the n-type semiconductor layer 11, the light emitting layer 13, and the p-type semiconductor layer 12 are sequentially and epitaxially grown. In the semiconductor layer 115, a surface positioned on the substrate (10) side is the first surface 15a, and a surface positioned on the opposite side to the substrate 10 is the second surface 15b.

The substrate 10 is, for example, a silicon substrate. The n-type semiconductor layer 11 includes, for example, a buffer layer which is provided on a main surface of the substrate 10, and an n-type GaN layer which is provided on the buffer layer. The p-type semiconductor layer 12 includes, for example, a p-type AlGaN layer which is provided on the light emitting layer 13, and a p-type GaN layer which is provided on the p-type AlGaN layer.

The light emitting layer 13 has, for example, a multiple quantum well (MQW) structure. The light emitting layer 13 contains materials which emit light such as blue light, violet light, bluish violet light, and ultraviolet light. A peak wavelength in the emission spectrum of the light emitting layer 13 is, for example, 430 nm to 470 nm.

Figure 3B:
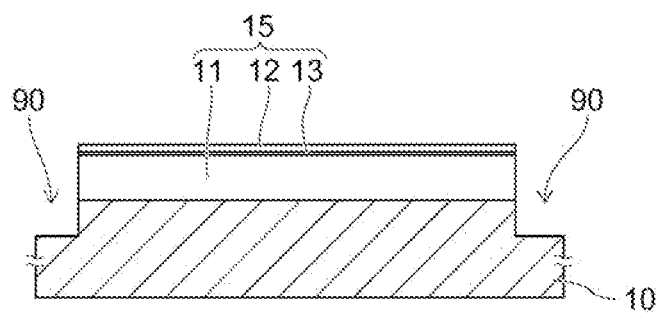

Subsequently, the semiconductor layer 115 is selectively removed, whereby grooves 90 are formed as illustrated in FIG. 3B. The semiconductor layer 115 is divided into the plurality of laminates 15 by the grooves 90. The grooves 90 are formed through the semiconductor layer 115 so as to reach the substrate 10. Thereafter, the substrate 10 is etched, whereby the bottoms of the grooves 90 become lower than the interfaces between the substrate 10 and the laminate 15. The etching depth of the substrate 10 is set to, for example, several µm or several tens µm.

Figure 4A:
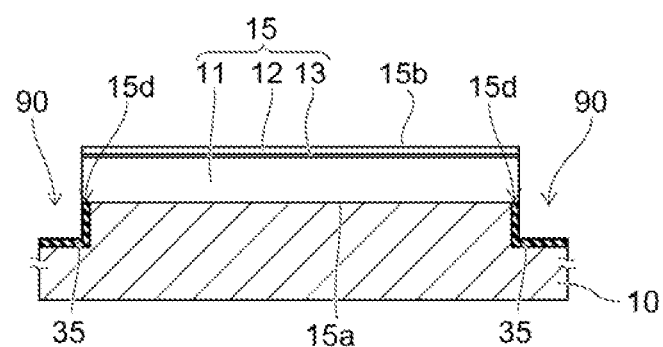
FIGS. 4A and 4B are cross-sectional views schematically illustrating manufacturing processes subsequent to that of the FIG. 3B.

Subsequently, portions of the substrate 10 exposed from the bottoms of the grooves 90 undergo, for example, thermal oxidation, whereby the insulating film 35 is formed as illustrated in FIG. 4A. The insulating film 35 is, for example, a silicon oxide film, and is formed on the first surfaces 15a of the laminate 15, so as to be in contact with the outer edge portions 15d of the laminate 15. Also, the insulating film 35 may be a silicon nitride film which is formed by performing plasma nitridation on the substrate 10.

Figure 4B:
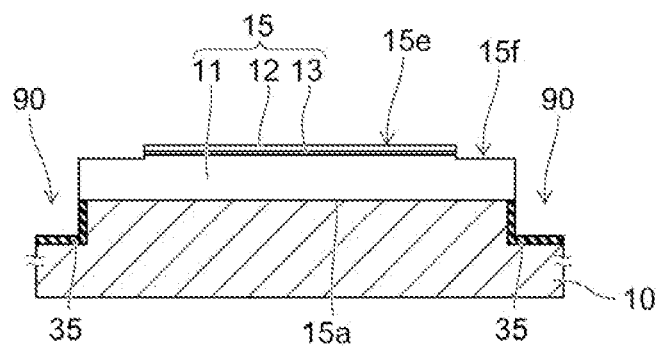

Subsequently, the p-type semiconductor layers 12 and the light emitting layers 13 of the laminate 15 are selectively removed, whereby some portions of the n-type semiconductor layers 11 are exposed as illustrated in FIG. 4B. For example, the p-type semiconductor layers 12 and the light emitting layers 13 are selectively etched by a reactive ion etching (RIE) method, whereby some portions of the n-type semiconductor layers 11 are exposed. As a result, the emitting regions 15e which include the light emitting layers 13, respectively, and the non-emitting regions 15f which do not include the light emitting layers 13 are formed.

Figure 5A:
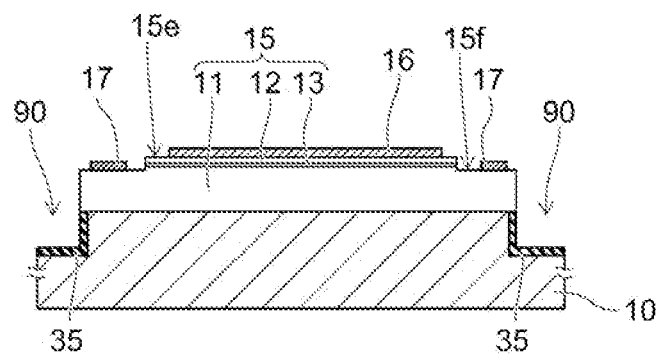
FIGS. 5A and 5B are cross-sectional views schematically illustrating manufacturing processes subsequent to that of the FIG. 4B.

Subsequently, as illustrated in FIG. 5A, on the emitting regions 15e, the p-side electrode 16 is formed, and on the non-emitting regions 15f, the n-side electrodes 17 are formed. The p-side electrode 16 is in contact with the surface of the p-type semiconductor layer 12. The n-side electrode 17 is in contact with the surface of the portions of the n-type semiconductor layers 11 exposed by selectively removing the p-type semiconductor layer 12 and the light emitting layer 13.

The p-side electrodes 16 and the n-side electrodes 17 are formed, for example, by a sputtering method or a vapor deposition method. Either of the p-side electrode 16 and the n-side electrode 17 may be first formed, or they may be formed using the same material at the same time.

The p-side electrodes 16 which are formed on the emitting regions 15e include reflective films which reflect emitted light of the light emitting layer 13. For example, the p-side electrodes 16 contain silver, a silver alloy, aluminum, an aluminum alloy, or the like. Also, the p-side electrodes 16 may include protective metal films (a barrier metal) for suppressing sulfuration and oxidation.

Figure 5B:
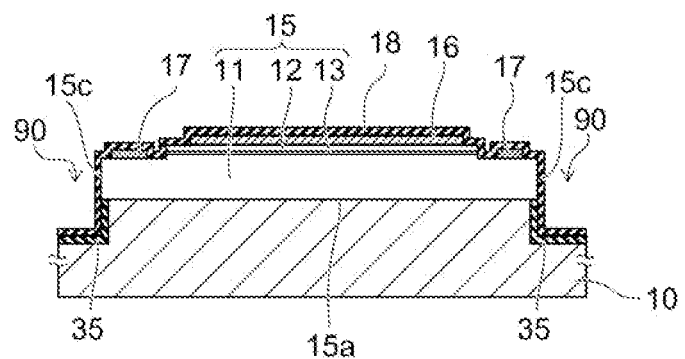

Next, the insulating film 18 is formed so as to cover the structure including the laminate 15 provided on the substrate 10 as illustrated in FIG. 5B. The insulating film 18 is a silicon oxide film or a silicon nitride film which is formed, for example, by a chemical vapor deposition (CVD) method.

The insulating film 18 covers the second surfaces 15b of the laminate 15, the p-side electrode 16, and the n-side electrode 17. Also, the insulating film 18 covers the side surfaces 15c connected to the second surfaces 15b of the laminate 15. The insulating film 18 covers the entire inner surfaces of the grooves 90. That is, the insulating film 18 is formed even on the insulating film 35 formed on the bottoms of the grooves 90.

Next, in the insulating film 18, the openings 18a and the openings 18b are formed. Each opening 18a is connected to the p-side electrode 16, and each opening 18b is connected to the n-side electrode 17.

Figure 6A:
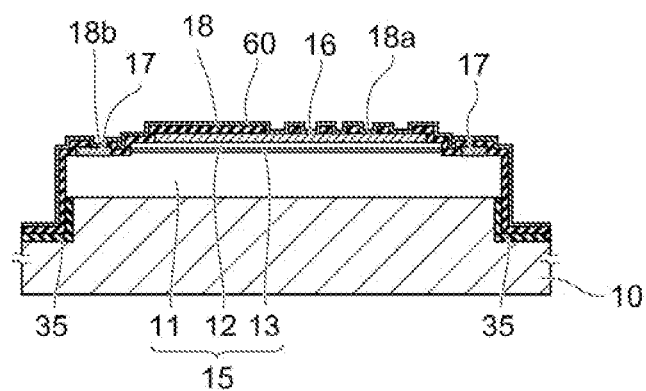
FIGS. 6A and 6B are cross-sectional views schematically illustrating manufacturing processes subsequent to that of the FIG. 5B.

Next, a base metal film 60 is formed so as to cover the surface of the insulating film 18, the inner surfaces (side walls and bottom surfaces) of the openings 18a, and the inner surfaces (side walls and bottom surfaces) of the openings 18b as illustrated in FIG. 6A. The base metal film 60 has a laminate structure which includes an aluminum film formed on the insulating film 18, a titanium film formed on the aluminum film, and a copper film formed on the titanium film. The base metal film 60 is formed, for example, by a sputtering method.

Figure 6B:
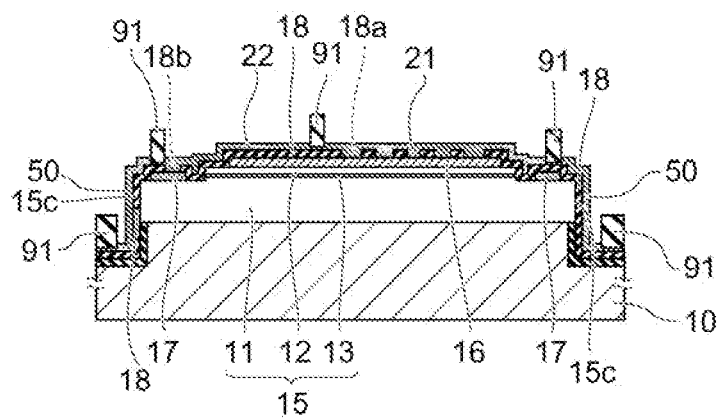

Next, the p-side wiring layers 21, the n-side wiring layers 22, and the metal films 50 are formed as illustrated in FIG. 6B. The p-side wiring layers 21, the n-side wiring layers 22, and the metal films 50 are formed, for example, by selectively performing copper plating using a resist mask 91 formed on the base metal film 60. The base metal film 60 serves as a seed layer which allows an electric current to flow, and the p-side wiring layers 21, the n-side wiring layers 22, and the metal films 50 are selectively formed on the copper film of the base metal film 60. The p-side wiring layers 21 are electrically connected to the p-side electrodes 16 through the openings 18*a*. The n-side wiring layers 22 are electrically connected to the n-side electrodes 17 through the openings 18*b*.

Figure 7A:
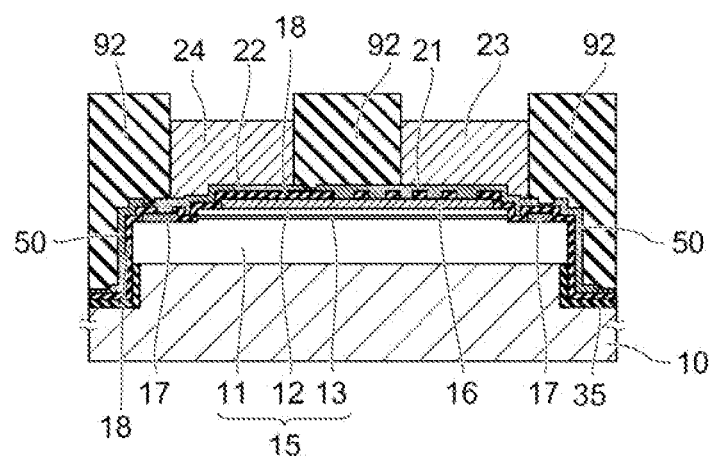
FIGS. 7A and 7B are cross-sectional views schematically illustrating manufacturing processes subsequent to that of the FIG. 6B.
Figure 7B:
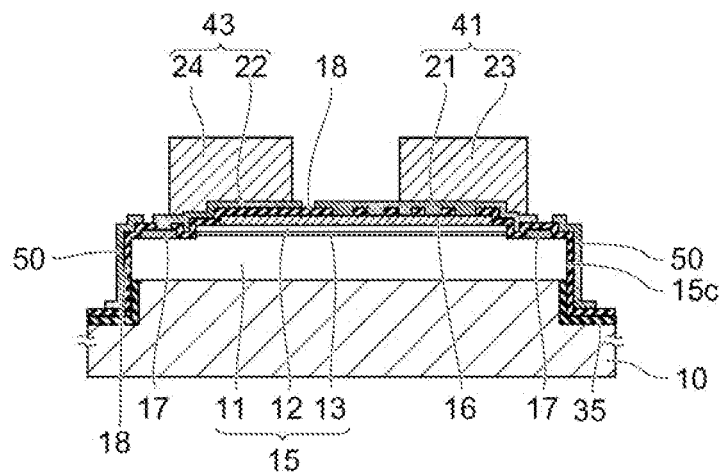

Next, the resist mask 91 is removed, for example, using a solvent or oxygen plasma, and then a resist mask 92 is formed as illustrated in FIG. 7A. Thereafter, on the p-side wiring layers 21 and the n-side wiring layers 22, p-side metal pillars 23 and n-side metal pillars 24 are formed, respectively.

The p-side metal pillars 23 and the n-side metal pillars 24 are formed, for example, by selective copper plating. The p-side metal pillars 23 are formed on the p-side wiring layers 21. The p-side wiring layers 21 and the p-side metal pillars 23 are integrated by the same copper material. The n-side metal pillars 24 are formed on the n-side wiring layers 22. The n-side wiring layers 22 and the n-side metal pillars 24 are the same copper material. The resist mask 92 covers the metal films 50. For this reason, on the metal films 50, metal pillars are not provided.

Subsequently, the resist mask 92 is removed, for example, using a solvent or oxygen plasma. At this time, the p-side wiring layers 21 and the n-side wiring layers 22 have been electrically connected to each other through the base metal film 60. Also, the p-side wiring layers 21 and the metal films 50 have been electrically connected to each other through the base metal film 60, and the n-side wiring layers 22 and the metal films 50 have been electrically connected to each other through the base metal film 60.

Therefore, in the next process, the base metal film 60 between the p-side wiring layers 21 and the n-side wiring layers 22, the base metal film 60 between the p-side wiring layers 21 and the metal films 50, and the base metal film 60 between the n-side wiring layers 22 and the metal films 50 are removed by etching. As a result, the electrical connections between the p-side wiring layers 21 and the n-side wiring layers 22, the electrical connections between the p-side wiring layers 21 and the metal films 50, and the electrical connections between the n-side wiring layers 22 and the metal films 50 are interrupted.

On the second surface sides of the laminate 15, the p-side wiring portions 41, the n-side wiring portions 43, and the metal film 50 are formed. The p-side wiring portion 41 includes the p-side wiring layers 21 and the p-side metal pillars 23. The n-side wiring portion 43 includes the n-side wiring layers 22 and the n-side metal pillars 24.

The metal film 50 which is formed around the side surfaces 15*c* of the laminate 15 are electrically in a floating state, and thus does not serve as an electrode. Each metal film 50 includes the aluminum film of the base metal film 60, and this serves as a reflective film.

Also, in the process illustrated in FIG. 6B, on the side surface 15*c* of each laminate 15, a plating film need not be formed. That is, the metal films 50 may be formed by leaving some portions of the base metal film 60 on the insulating film 18. For example, if the resist mask 91 is formed so as to cover the side surfaces 15*c* of the laminate 15, no plating film is formed on the base metal film 60.

In a case of using the base metal film 60 as the metal film 50, in the process of interrupting the electrical connections between the p-side wiring layers 21 and the n-side wiring layers 22, the base metal film 60 is etched such that some portions to be the metal film 50 remain. That is, if the portions to be the metal film 50 are covered by a resist film, it is possible to leave the corresponding portions of the base metal film 60 on the insulating film 18, thereby forming the metal film 50.

Since the metal film 50 is thinly formed as described above, dicing for separating semiconductor light emitting devices 1 becomes easy. Also, it becomes difficult for the diced side surfaces to be damaged, and thus it is possible to improve the reliability of the semiconductor light emitting devices 1.

Figure 8A:
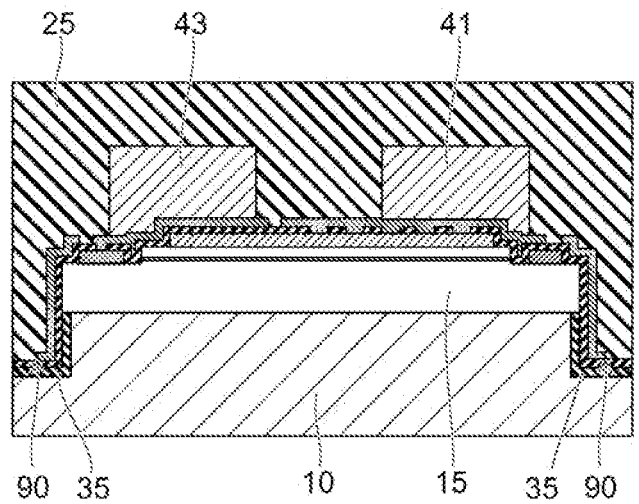
FIGS. 8A and 8B are cross-sectional views schematically illustrating manufacturing processes subsequent to that of the FIG. 7B.

Next, the resin layer 25 is formed so as to cover the p-side wiring portion 41 and the n-side wiring portion 43 and fill up the grooves 90 as illustrated in FIG. 8A. The resin layer 25 covers the metal film 50 inside the grooves 90. For the resin layer 25, it is possible to use a variety of materials such as an epoxy resin, a silicone resin, or a fluorine resin.

For example, the resin layer 25 may be formed of a black resin containing a light shielding material such as carbon particles. In this case, it is possible to reduce light leakage from the second surface (15*b*) sides of the laminate 15. Also, the resin layer 25 may be formed of a white resin containing a reflective material such as titanium oxide. In this case, it is possible to omit the metal film 50. Further, the flexibility of the resin layer 25 may be appropriately controlled by adding fillers to the resin layer 25.

Figure 8B:
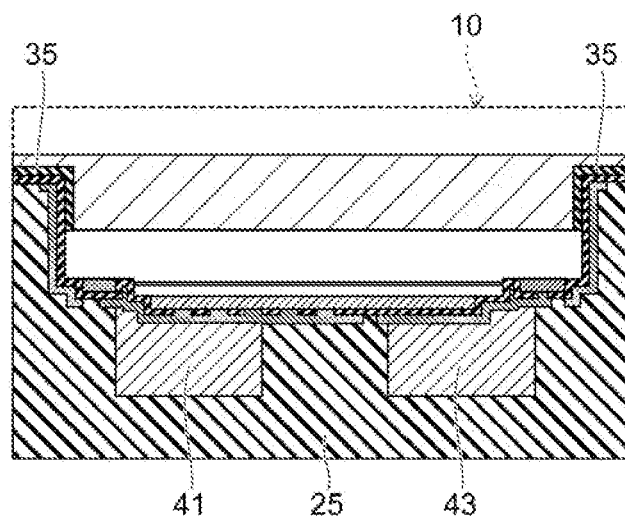
Figure 9A:
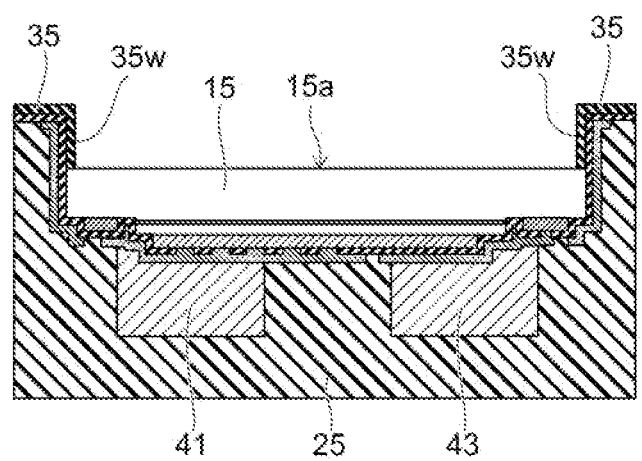
FIGS. 9A and 9B are cross-sectional views schematically illustrating manufacturing processes subsequent to that of the FIG. 8B.

Next, the rear surface side of the substrate 10 is ground such that the thickness of the substrate 10 decreases as illustrated in FIG. 8B. Further, the ground thin substrate 10 is removed as illustrated in FIG. 9A, for example, by wet etching. Alternatively, the thin substrate 10 may be removed, for example, by dry etching.

After removal of the substrate 10, the resin layer 25, the p-side wiring portion 41, and the n-side wiring portion 43 support the laminate 15, such that a state of a wafer including the plurality of devices is maintained.

For example, the laminate 15 epitaxially grown on the substrate 10 may have internal stress. In this case, even if the internal stress formed during epitaxial growth is released at all at once during peeling-off (removal) of the substrate 10, since the resin layer 25 is a material more flexible than the laminate 15, the resin layer 25 absorbs the released stress, whereby it is possible to avoid damage of the laminate 15.

After the substrate 10 is removed, the first surfaces 15*a* of the laminate 15 and the insulating film 35 are exposed. Further, it is preferable to form micro irregularities (not specifically illustrated) on the first surfaces 15*a*. That is, first surfaces 15*a* can be roughened or micropatterned to for surface irregularities on first surfaces 15*a* to reduce interface reflections at the first surface 15*a*.

For example, it is possible to perform wet etching on the first surface (15*a*) sides of the laminate 15 by an aqueous potassium hydroxide (KOH) solution, tetramethylammonium hydroxide (TMAH), or the like. The speed of this etching depends on the orientation of the crystal plane. Therefore, it is possible to form irregularities on the first surfaces 15*a*. As a result, it is possible to improve the efficiency of extracting of emitted light of the light emitting layers 13 from the first surfaces 15*a*.

Figure 9B:
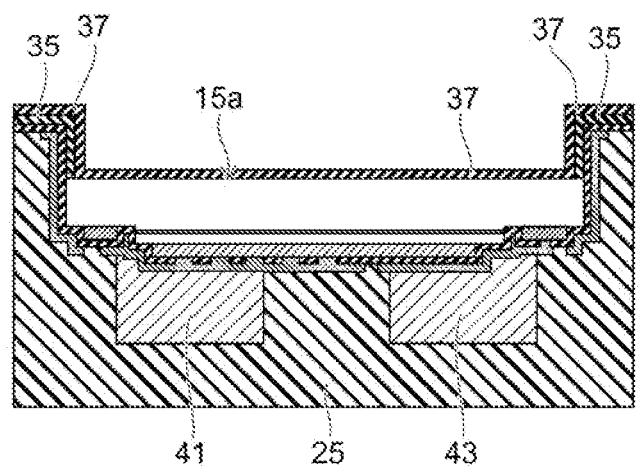

Next, the insulating film 37 is formed so as to cover the first surfaces 15*a* of the laminate 15 and the insulating film 35 as illustrated in FIG. 9B. The insulating film 37 is, for example, an inorganic film such as a silicon nitride film or a silicon oxide film, and may be formed by a plasma CVD method.

Figure 10A:
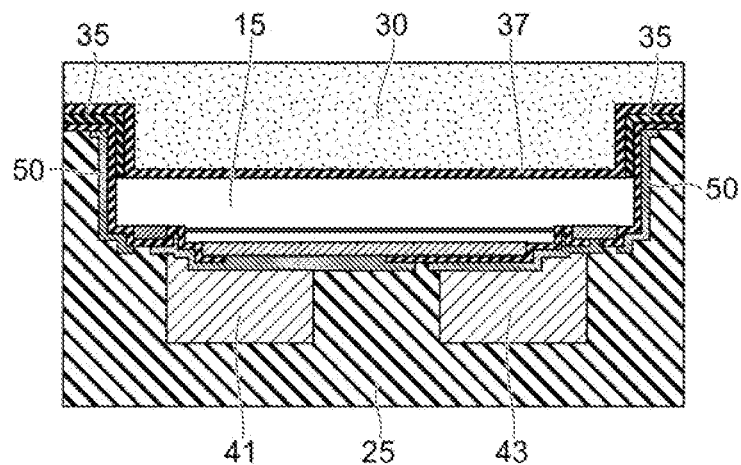
FIGS. 10A and 10B are cross-sectional views schematically illustrating manufacturing processes subsequent to that of the FIG. 9B.
Figure 10B:
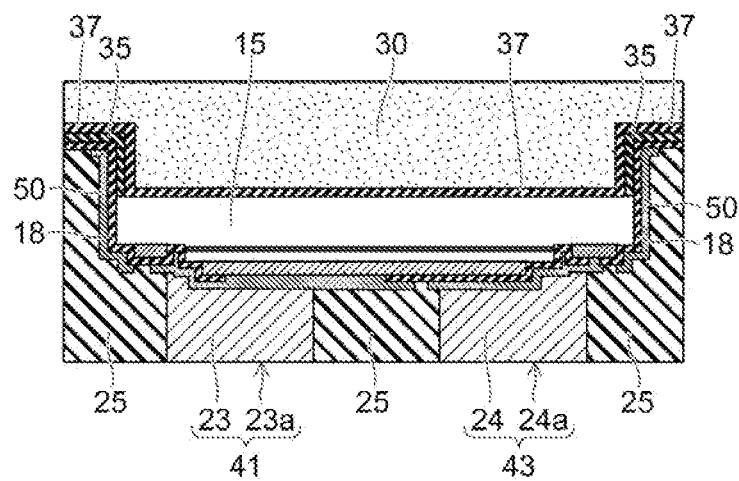

Next, on the insulating film 37, the resin layer 30 is formed as illustrated in FIG. 10A. For the resin layer 30, for example, a silicon resin which transmits emitted light of the light emitting layers 13 may be used. The resin layer 30 may be formed by a method such as printing, potting, molding, or compression molding. Also, the resin layer 30 is formed so as to contain the fluorescent substance 33 which absorbs light of the light emitting layers 13 and emits yellow light.

For example, in a case where the resin layer 30 does not contain the fluorescent substance 33, the semiconductor light emitting device 1 becomes an LED which emits blue light. Also, in a case where the resin layer 30 contains the fluorescent substance 33, the semiconductor light emitting device 1 becomes an LED which emits white light which is a mixture of blue light and yellow light.

Next, a semiconductor light emitting device 2 according to a modification of the first embodiment will be described with reference to FIGS. 11 to 13B.

Figure 11:
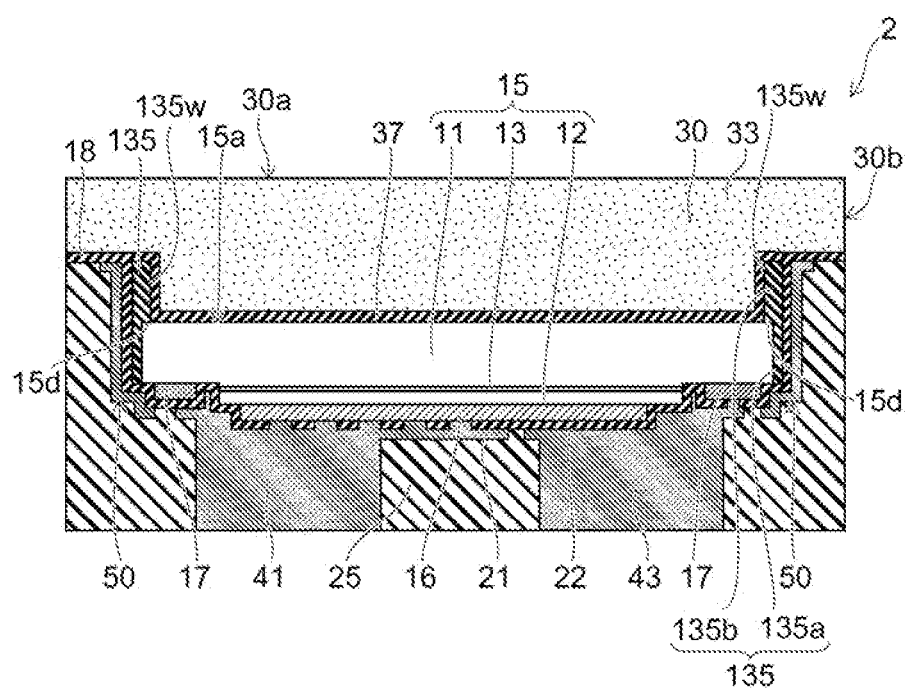
FIG. 11 is a cross-sectional view schematically illustrating a semiconductor light emitting device according to a modification of the first embodiment.

FIG. 11 is a cross-sectional view schematically illustrating the semiconductor light emitting device 2 according to the modification of the first embodiment. FIGS. 12A to 13B are cross-sectional views schematically illustrating a method of manufacturing the semiconductor light emitting device 2.

Hereinafter, portions including the same elements as those of the semiconductor light emitting device 1 will not be described, and different configurations will be described.

The semiconductor light emitting device 2 illustrated in FIG. 11 includes an insulating film 135 which covers the side surfaces 15c of the laminate 15. The insulating film 135 is provided so as to surround the laminate 15. The insulating film 135 includes first portions 135a and second portions 135b. The first portions 135a cover the side surfaces 15c. The second portions 135b are provided so as to be in contact with the outer edge portions 15d of the laminate 15, and have wall surfaces 135w positioned inside the outer edge portions 15d.

As illustrated in FIG. 11, the insulating film 37 is provided so as to cover the first surfaces 15a of the laminate 15, and the wall surfaces 135w. Thereafter, on the insulating film 37, the resin layer 30 is provided. The resin layer 30 covers the first surfaces 15a and the wall surfaces 135w. Subsequently, the insulating film. 18 is provided so as to cover the opposite surface of the insulating film 135 to the wall surfaces 135w. Next, the metal film 50 is provided so as to cover the insulating film 135 with the insulating film 18 interposed therebetween.

In the semiconductor light emitting device 2, of emitted light of the light emitting layer 13, light which propagates in a horizontal direction (toward the side surfaces 15c) is guided toward the light emitting surface 30a by the insulating film 135. Therefore, it is possible to improve the uniformity of brightness at the light emitting surface 30a.

Subsequently, the method of manufacturing the semiconductor light emitting device 2 will be described with reference to FIGS. 12A to 13B. FIGS. 12A to 13B are cross-sectional views schematically illustrating processes of manufacturing the semiconductor light emitting device 2.

Figure 12A:
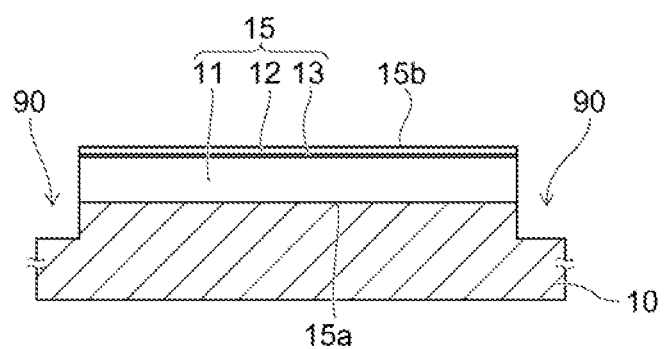
FIGS. 12A and 12B are cross-sectional views schematically illustrating processes of manufacturing the semiconductor light emitting device according to the modification of the first embodiment.

FIG. 12A is a cross-sectional view illustrating a laminate 15 formed on the substrate 10. For example, as illustrated in FIG. 3A, the semiconductor layer 115 is formed on the substrate 10 so as to have the laminate structure including the n-type semiconductor layer 11, the p-type semiconductor layer 12, and the light emitting layer 13. Thereafter, portions of the semiconductor layer 115 are selectively removed, whereby the grooves 90 are formed and a plurality of laminates 15 is formed on the wafer. The grooves 90 are formed through the semiconductor layer 115 so as to reach the substrate 10. Thereafter, the substrate 10 is etched, whereby the bottoms of the grooves 90 become lower than the interfaces between the substrate 10 and the laminate 15.

Figure 12B:
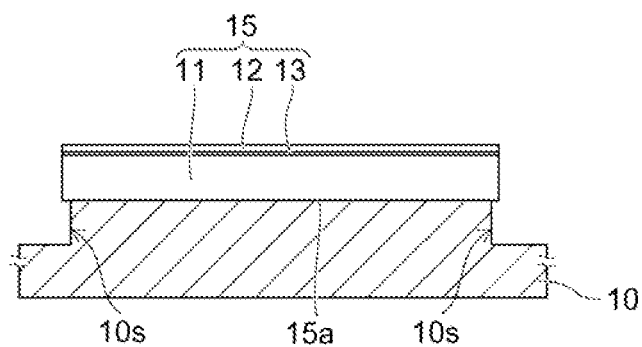

Next, the substrate 10 exposed from the bottoms of the grooves 90 is etched as illustrated in FIG. 12B, for example, by a wet etching method. The grooves 90 are formed so as to have an overhang structure in which the bottoms of the grooves 90 extend below the laminate 15.

Figure 13A:
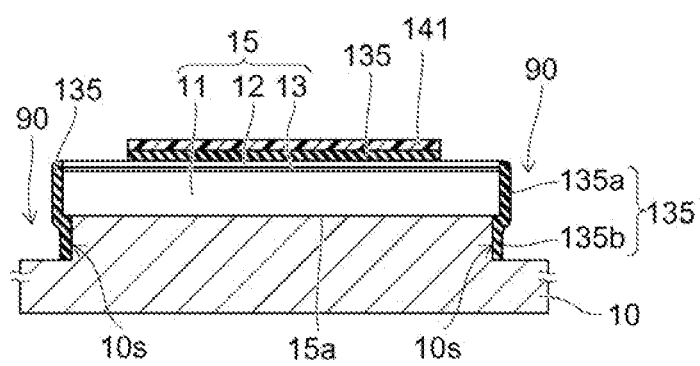
FIGS. 13A and 13B are cross-sectional views schematically illustrating manufacturing processes subsequent to that of the FIG. 12B.

Next, the insulating film 135 is formed so as to cover the wall surfaces of the grooves 90 as illustrated in FIG. 13A.

For example, the insulating film 135 is formed so as to cover the second surfaces 15b of the laminate 15 and the inner surfaces of the grooves 90. The insulating film 135 is a silicon nitride film which is formed, for example, by a CVD method.

Subsequently, on the insulating film 135 formed on the second surfaces 15b, an etching mask 141 is selectively formed. Thereafter, the insulating film 135 is selectively etched using the etching mask 141. At this time, for example, the insulating film 135 is selectively removed by anisotropic dry etching such that the insulating film 135 remains on the wall surfaces of the grooves 90. The insulating film 135 covering the wall surfaces of the grooves 90 includes the first portions 135a covering the side surfaces 15c of the laminate 15, and the second portions 135b covering side walls 10s formed in the substrate 10.

Figure 13B:
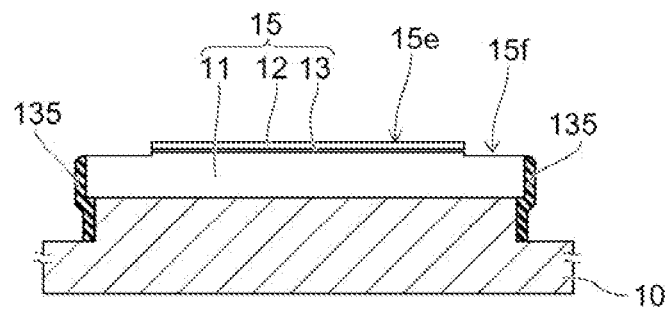

Next, the p-type semiconductor layers 12 and the light emitting layers 13 of the laminate 15 are selectively removed, whereby some portions of the n-type semiconductor layers 11 are exposed as illustrated in FIG. 13B. That is, the p-type semiconductor layers 12 and the light emitting layers 13 are selectively etched using the insulating film 135 remaining on the second surfaces 15b as a mask, for example, by a reactive ion etching (RIE) method, whereby some portions of the n-type semiconductor layer 11 are exposed. As a result, the emitting regions 15e which include the light emitting layers 13, respectively, and the non-emitting regions 15f which do not include the light emitting layers 13 are formed.

Next, as illustrated in FIG. 5A, on the emitting regions 15e, the p-side electrodes 16 are formed, and on the non-emitting regions 15f, the n-side electrodes 17 are formed. Subsequently, the processes illustrated in FIGS. 5B to 10B are performed, whereby the semiconductor light emitting device 2 is completed.

It is preferable that the refractive index of the insulating film 135 is larger than the refractive index of the insulating film 37. For example, a silicon nitride film is used as the insulating film 135, and a silicon oxide film is used as the insulating film 37. Also, it is preferable that the refractive index of the resin layer 30 is smaller than the refractive index of the insulating film 135. In this case, it is possible to efficiently guide light emitted from the end portions of the laminate 15 toward the light emitting surface 30a.

Second Embodiment

A semiconductor light emitting device 3 according to a second embodiment will be described with reference to FIGS. 14 to 16B.

Figure 14:
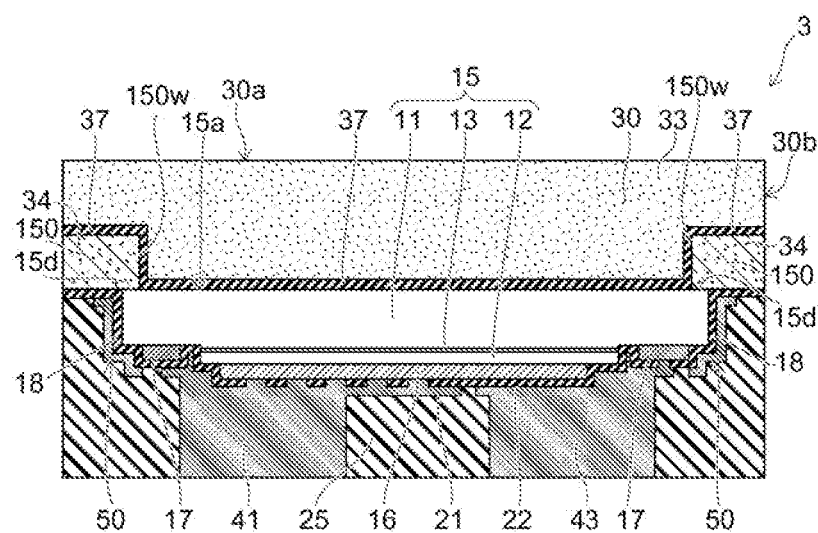
FIG. 14 is a cross-sectional view schematically illustrating a semiconductor light emitting device according to a second embodiment.

FIG. 14 is a cross-sectional view schematically illustrating the semiconductor light emitting device 3 according to the second embodiment.

FIGS. 15A to 16B are cross-sectional views schematically illustrating processes of manufacturing the semiconductor light emitting device 3 according to the second embodiment.

The semiconductor light emitting device 3 includes an insulating film 150 which is provided around an outer edge portion of the laminate 15. The insulating film 150 is provided so as to be in contact with the outer edge portions 15d of the first surfaces 15a of the laminate 15. Further, the insulating film 150 has wall surfaces 150w positioned inside the outer edge portions 15d.

As illustrated in FIG. 14, the insulating film 37 is provided so as to cover the first surfaces 15a of the laminate 15, and the wall surfaces 150w. Thereafter, on the insulating film 37, the resin layer 30 is provided. The resin layer 30 contains, for example, the fluorescent substance 33 (a first fluorescent substance).

The insulating film 150 is provided so as to contain, for example, a second fluorescent substance (hereinafter, referred to as a fluorescent substance 34). For example, the fluorescent substance 34 absorbs emitted light of the light emitting layers 13, and emits light having wavelengths different from the wavelengths of light which the fluorescent substance 33 emits. The fluorescent substance 34 emits light having wavelengths longer than the wavelengths of light which the fluorescent substance 33 emits. The fluorescent substance 33 is, for example, a YAG fluorescent substance which emits yellow light, and the fluorescent substance 34 is, for example, a nitride fluorescent substance which emits red light.

Since the semiconductor light emitting device 3 includes the insulating film 150 containing the second fluorescent substance, it is possible to improve the light emitting properties of the semiconductor light emitting device 3. In the semiconductor light emitting device 3, since the second fluorescent substance is disposed separated from the first fluorescent substance contained in, for example, the resin layer 30, it is possible to suppress mutual absorption between the fluorescent substances, and to improve emission intensity. Also, since the insulating film 150 is disposed so as to surround the laminate 15, it is possible to suppress color irregularity attributable to light emitted from the side surfaces 15c of the laminate 15.

Subsequently, the method of manufacturing the semiconductor light emitting device 3 will be described with reference to FIGS. 15A to 16B.

Figure 15A:
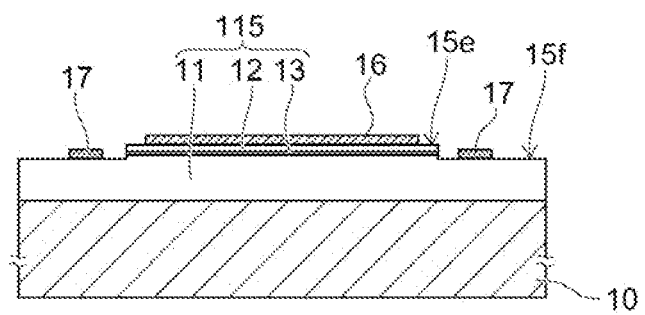
FIGS. 15A and 15B are cross-sectional views schematically illustrating processes of manufacturing the semiconductor light emitting device according to the second embodiment.

FIG. 15A illustrates a state where the emitting regions 15e, the p-side electrode 16, the non-emitting regions 15f, and the n-side electrodes 17 have been formed on the semiconductor layer 115. In this example, before the grooves 90 are formed, the emitting regions 15e and the non-emitting regions 15f are formed. Subsequently, the p-side electrodes 16 are formed on the emitting regions 15e, and the n-side electrodes 17 are formed on the non-emitting regions 15f.

Figure 15B:
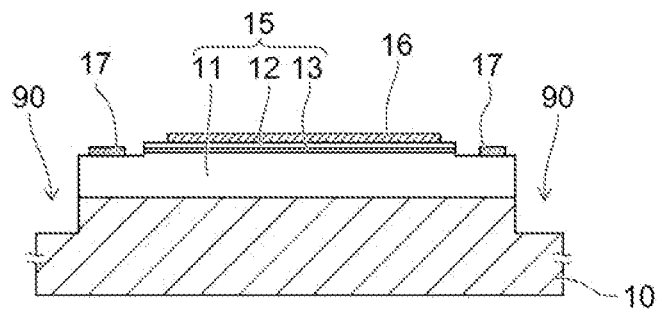

Next, the n-type semiconductor layers 11 are selectively removed, whereby the grooves 90 are formed as illustrated in FIG. 15B. The grooves 90 are formed through the n-type semiconductor layer 11 so as to reach the substrate 10. Thereafter, the substrate 10 is etched, whereby the bottoms of the grooves 90 become lower than the interfaces between the substrate 10 and the laminate 15.

Figure 16A:
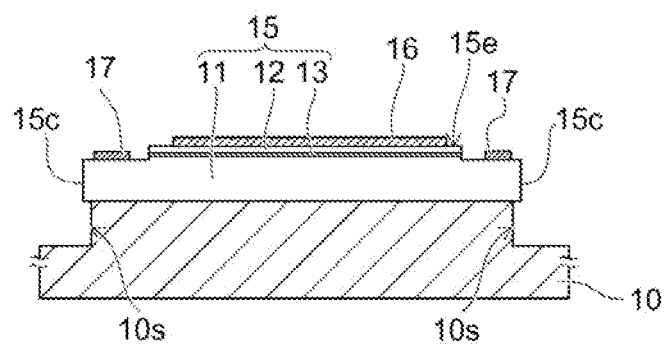
FIGS. 16A and 16B are cross-sectional views schematically illustrating manufacturing processes subsequent to that of the FIG. 15B.

Next, the substrate 10 exposed from the bottoms of the grooves 90 is etched as illustrated in FIG. 16A, for example, by a wet etching method. The grooves 90 are formed so as to have an overhang structure in which the bottoms of the grooves 90 extend below the laminate 15.

Figure 16B:
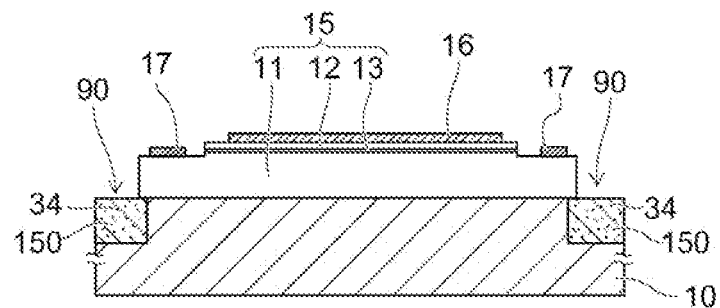

Next, the insulating film 150 is formed so as to fill up the bottoms of the grooves 90 as illustrated in FIG. 16B.

The insulating film 150 is formed of, for example, a resin, and contains the fluorescent substance 34. The insulating film 150 is formed by a method such as printing or potting.

Next, the insulating film 18 is formed so as to cover the structure including the laminate 15 provided on the substrate 10 as illustrated in FIG. 5B. Subsequently, the processes illustrated in FIGS. 6A to 10B are performed, whereby the semiconductor light emitting device 3 is completed.

For the insulating film 150, for example, it is preferable to use a material resistant to an etchant for wet etching of a silicon substrate. In this case, in the process of removing the substrate 10 illustrated in FIG. 8B, it is possible to use wet etching having an etching speed higher than that of dry etching. As a result, it is possible to reduce a time (tact) necessary to remove the substrate 10, and to improve the manufacturing efficiency.

Incidentally, in this disclosure, the term "nitride semiconductor" includes group III-V compound semiconductors of $B_xIn_yAl_zGa_{1-x-y-z}N$ (wherein $0 \leq x \leq 1$, $0 \leq y \leq 1$, $0 \leq z \leq 1$, and $0 \leq x+y+z \leq 1$), and also includes mixed crystal containing nitrogen (N), phosphorous (P), arsenic (As), or the like as a group V element. Further, the term "nitride semiconductor" includes group III-V compound semiconductors or mixed crystal further containing a variety of added elements for controlling a variety of physical properties such as a conductivity type, and group III-V compound semiconductors or mixed crystal further containing a variety of unintended elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light emitting device, comprising:
   a first layer of a first conductivity type and a second layer of a second conductivity type;
   a light emitting layer between, in a first direction, the first and second layers,
   a resin layer on a first surface of the first layer such that the first layer is between the resin layer and the second layer in the first direction, the first layer having an outer portion extending beyond the second layer and light emitting layers in a second direction perpendicular to the first direction to an outer edge of the first layer;
   a first electrode contacting the first layer in the outer portion on a second surface opposite the first surface;
   a second electrode contacting the second layer; and
   a first insulating material contacting the first surface in the outer portion of the first layer and having a wall surface extending in the first direction from the first surface at a position that is in the outer portion and spaced in the second direction from the outer edge.

2. The light emitting device according to claim 1, wherein the first insulating material extends in the second direction along the outer edge of the first layer from the first surface to the second surface.

3. The light emitting device according to claim 1, wherein the first insulating material includes a fluorescent substance which absorbs light at a wavelength emitted by the light emitting layer and emits light at a wavelength different from the wavelength emitted by the light emitting layer.

4. The light emitting device according to claim 1, further comprising:
   a reflective material disposed on the first insulating material such that the wall surface is between the resin layer and the reflective material in the second direction, the reflective material being reflective of light at a wavelength of light emitted by the light emitting layer, wherein the first insulating material transmits light at a wavelength emitted by the light emitting layer.

5. The light emitting device according to claim 1, wherein the resin layer includes a fluorescent substance which absorbs light at a wavelength emitted by the light emitting layer and emits light at a wavelength different from the wavelength emitted by the light emitting layer.

6. The light emitting device according to claim 1, further comprising:

a second insulating material between the resin layer and the first insulating material and having a refractive index at a wavelength of light emitted by the light emitting layer that is lower than a refractive index of the first insulating material at the wavelength of light emitted by the light emitting layer.

7. The light emitting device according to claim 1, wherein the resin layer includes a first fluorescent substance which absorbs light at a first wavelength emitted by the light emitting layer and emits light at a second wavelength different from the first wavelength, and the first insulating material includes a second fluorescent substance which absorbs light at the first wavelength and emits light at a third wavelength different from the first wavelength.

8. The light emitting device according to claim 7, further comprising:

a second insulating material between the resin layer and the first insulating material and having a refractive index that is lower than a refractive index of the first insulating material.

9. The light emitting device according to claim 7, wherein the third wavelength is longer than the second wavelength.

* * * * *